United States Patent [19]

Fuchs

[11] Patent Number: 5,213,994
[45] Date of Patent: May 25, 1993

[54] METHOD OF MAKING HIGH VOLTAGE SEMICONDUCTOR DEVICE

[75] Inventor: Earl D. Fuchs, Phoenix, Ariz.

[73] Assignee: Motorola, Inc., Schaumburg, Ill.

[21] Appl. No.: 583,527

[22] Filed: Sep. 17, 1990

Related U.S. Application Data

[62] Division of Ser. No. 358,215, May 30, 1989, Pat. No. 4,974,050.

[51] Int. Cl.$^5$ .............................................. H01L 21/76
[52] U.S. Cl. ..................................... 437/65; 437/67
[58] Field of Search ............... 437/65, 67, 64, 227; 148/DIG. 50

[56] References Cited

U.S. PATENT DOCUMENTS

| 4,140,558 | 2/1979 | Murphy et al. | 437/67 |
| 4,520,552 | 6/1985 | Arnould et al. | 437/67 |
| 4,711,013 | 12/1987 | Cammert | 437/67 |

FOREIGN PATENT DOCUMENTS

| 193116 | 9/1986 | European Pat. Off. | 437/67 |
| 58-70585 | 4/1983 | Japan | 437/67 |

*Primary Examiner*—George Fourson
*Attorney, Agent, or Firm*—Joe E. Barbee; Robert M. Handy

[57] ABSTRACT

An improved method and structure for high voltage semiconductor devices capable of blocking voltages of the order of 1000 volts and greater is described. In a preferred embodiment, a blanket P layer is formed in an N− epi-layer on an N+ substrate. An annular groove is etched through the blanket P layer into the N− epi-layer. The bottom of the groove is doped N+ using the same mask as for the first groove etch. A second groove is formed inside of and partly overlapping the first groove and extending to a greater depth than the first groove, but not through the epi-layer. The second groove is filled with passivating material, metal electrodes are applied to the P+ region and the N+ substrate, and the devices separated at the N+ region lying outside the second groove in the bottom of the first groove. Excellent high voltage blocking characteristics are obtained with the same or fewer process steps and better yield.

8 Claims, 3 Drawing Sheets

METHOD OF MAKING HIGH VOLTAGE SEMICONDUCTOR DEVICE

This is a continuation division of application Ser. No. 07/338,315, filed May 30, 1989, now U.S. Pat. No. 4,974,050.

FIELD OF THE INVENTION

This invention concerns means and methods for semiconductor devices and, more particularly, means and methods for semiconductor power devices intended to operate in the presence of very high voltages.

BACKGROUND OF THE INVENTION

Semiconductor devices capable of providing blocking voltages of the order of $10^3$ volts or higher are well known in the art. Typical devices are diodes and thyristors. Generally, these devices are also intended to carry substantial currents, e.g., 1-100 amperes.

It is known that in order to provide blocking voltages of $10^3$ volts or higher, great care must be taken to control the electric field distribution where the blocking junction intersects the device surface. If this is not done properly, then flash-over or channeling or both will occur and device operation will be unsatisfactory.

Because of their widespread use, there is a continuing need to find improved structures and manufacturing methods for high voltage semiconductor devices so that performance may be improved and/or cost reduced or a combination thereof. Accordingly, it is an object of the present invention to provide an improved means and method for semiconductor devices, particularly semiconductor devices employing high voltage blocking junctions, wherein the number of manufacturing steps is maintained or reduced while manufacturing yield is improved for the same or better device performance than with the prior art. While the present invention is advantageous for use with any type of high voltage blocking junction, it is particularly useful for very high voltage, high current diodes, thyristors, transistors and the like, and it is therefore a further object to provide an improved means and method for such devices.

There are two general categories of devices known in the art; mesa devices where the blocking junction intersects a die or groove sidewall, and planar devices where the blocking junction intersects a major face of the die. Each has advantages and disadvantages. The present invention is most useful with mesa structures but may also be applied in combination with planar structures.

BRIEF SUMMARY OF THE INVENTION

The foregoing and other objects and advantages are achieved, in a first embodiment, by a structure comprising: a semiconductor substrate of a first conductivity and first type and having a first principal surface; a first doped region of a first thickness in the substrate, extending to the first surface, and of a second type opposite the first type and of a second conductivity; a groove extending into the substrate from the first surface to a depth exceeding the first thickness; and a second doped region of the first type and of a third conductivity greater than the first conductivity, separated from the first doped region by the groove and having an outward facing surface depressed relative to the first surface.

It is desirable that a passivating material substantially fill the groove. In a preferred embodiment the groove is annular when viewed perpendicular to the first surface and laterally surrounds the first doped region, and the second doped region is also annular and laterally surrounds the groove. Where the substrate comprises a relatively lightly doped portion having a predetermined thickness and containing the first and second doped regions, it is desirable that the groove depth be between fifty and one hundred percent of the predetermined thickness, preferably about two-thirds the predetermined thickness.

In a further aspect of the present invention the foregoing objects and advantages are provided by the method comprising: providing a substrate having a first doped region of a first thickness adjacent a first surface thereof; forming a first groove extending from the first surface through the first doped region; forming a second doped region at least on a bottom part of the first groove; and forming a second groove having at least a first part overlapping a part of the first groove and extending into the substrate from the first surface through the part the first groove. In a preferred embodiment it is desirable that the foregoing steps leave a portion of the second doped region in the bottom of the first groove unaffected so that a portion of the second doped region lies laterally outside the second groove.

It is desirable that the first part of the second groove has a smaller perimeter than the first groove. It is further desirable to form a second part of the second groove spaced apart from and having the same depth as and having a perimeter greater than the first part of the second groove. In a preferred embodiment, the foregoing steps comprise forming the second part with a perimeter greater than a perimeter of the first groove and forming spaced-apart first and second parts of the second groove separated by a portion of the bottom of the first groove so that an annular shaped portion of the bottom of the first groove is left between the first and second parts of the second groove.

The invented means and method will be more fully understood by considering the figures briefly described below and the detailed description thereof that follows.

DETAILED DESCRIPTION OF THE DRAWINGS

Figure 1:
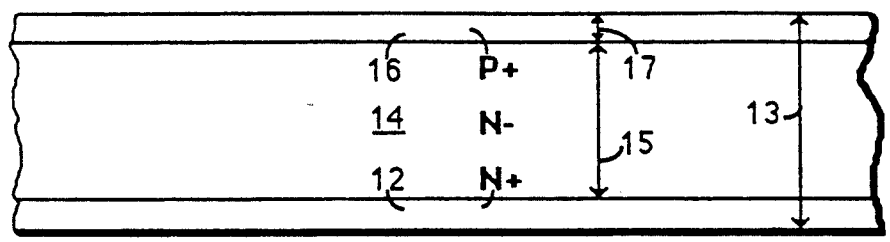
FIGS. 1-5 show simplified schematic cross-sectional views of a semiconductor device having a high voltage blocking junction, according to the prior art and at different stages of manufacture.

For convenience of explanation, the description that follows illustrates the prior art and the present invention in the context of a high voltage ($>/=10^3$ volt), high current ($>/=10^1$ Amp) diode using particular combinations of N and P regions. However, those of skill will understand based on the description herein that this is merely for ease of explanation and that the present invention applies to any semiconductor device having at least one PN junction, as for example, but not limited to rectifiers, thyristors, transistors, reverse switching rectifiers, TRIACS and combinations thereof, and further that N and P may be interchanged.

Referring now to FIGS. 1-5, according to the prior art, semiconductor substrate 10 comprises N+ region 12, N− region 14 and P+ region 16, typically prepared by epitaxially growing region 14 on initial substrate 12 and thereafter creating region 16 by further epitaxial growth or doping. Substrate 10 has thickness 13 of typically about 0.69 mm (27 mils), N-region 14 has thickness 15 of about 110 micrometers and P+ doped region 16 has thickness 17 of about 10 micrometers. These are merely illustrations of typical values and are not intended to be limiting. Means for forming such structures are well known in the art.

Grooves 22 of depth 24 are formed in substrate 10, for example, by sawing or by etching through holes 20 in mask 18. Such methods are well known in the art. This provides the structure shown in FIG. 2.

Figure 2:
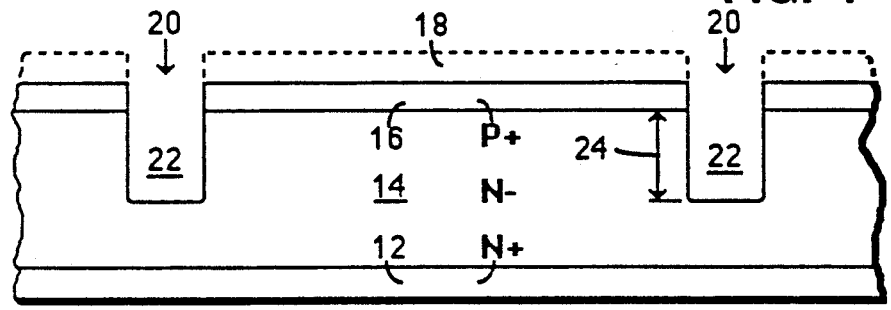
Figure 3:
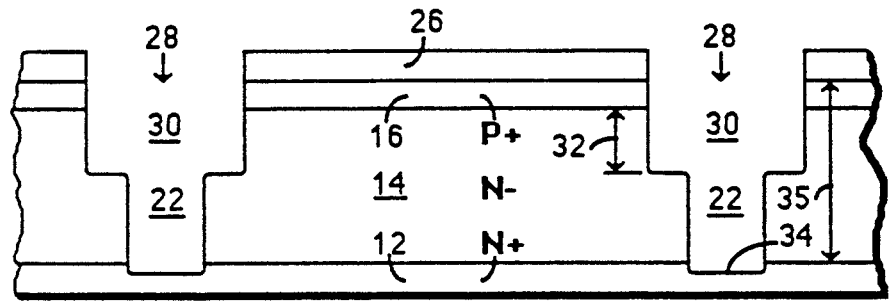

Mask 26 having openings 28 is then applied to the surface of the structure of FIG. 2 and further etching carried out to deepen grooves 22 to penetrate into N+ region 12. Opening 28 are generally wider than openings 20 so that stepped sidewalls are obtained in resulting grooves 30 of depth 32, as illustrated in FIG. 3.

Figure 4:
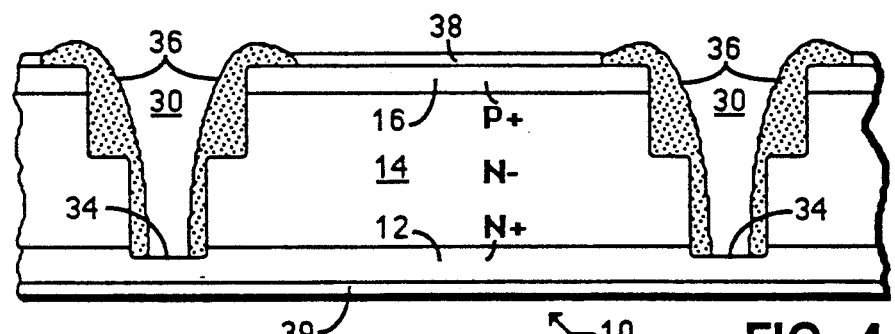

Passivation material 36, as for example a glass or organic polymer is spun on or otherwise applied and patterned as shown in FIG. 4 using means well known in the art to cover the sidewalls of grooves 30. This passivation protects the PN junction formed between N− region 14 and P+ region 16 that extends to the sidewalls of grooves 30. Metal layers 38 and 39 are also formed using well known means to provide ohmic contact to the semiconductor regions. Substrate 10 is then separated into individual device die 11 by conventional means, as for example sawing or etching, to provide the finished device illustrated in FIG. 5.

Figure 5:
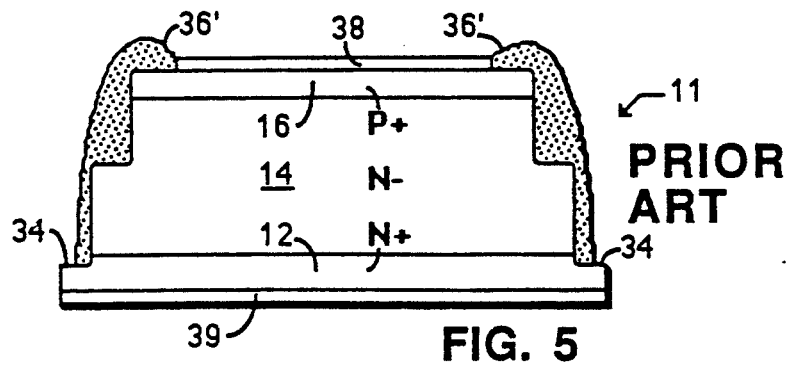
Figure 6:
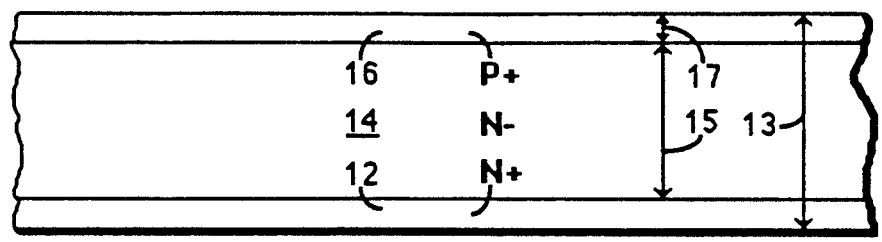
FIGS. 6-10 show simplified schematic cross-sectional views of a semiconductor device having a high voltage blocking junction, according to a first embodiment of the present invention and at different stages of manufacture.

Four masking operations or equivalent are required to produce the structure illustrated in FIG. 5. These are, delineate groove 20, delineate groove 30, delineate passivation 36, and delineate metal 38.

While the process and structure illustrated in FIGS. 1-5 provide junctions having high voltage ($>/=10^3$ volt) capability and adequate current carrying capacity, the manufacturing yield suffers from the limitation that sawing or etching grooves 22,30 completely through N− region 14 into N+ region 12, which is necessary to prevent channelling, significantly weakens substrate 10 so that breakage during manufacturing continues to be a problem. This is undesirable. Further, deep grooves 22,30 require extremely long etch times. This is also undesirable for both cost and yield. Prior art attempts to avoid the limitations and deficiencies of the above-described process have either required additional masking operations or failed to adequately prevent channelling or a combination thereof. Accordingly, a need continues to exist for an improved process which avoids the wafer weakening deep grooves and long etch times, which does not add masking operations or equivalent and which gives the same or better device properties, e.g., high blocking voltage and low leakage current.

The above described problems are overcome by the structure and process of the present invention illustrated in a first embodiment in FIGS. 6-11. As noted earlier in connection with the description of the prior art, the particular choice of N and P regions and of a rectifying diode is merely for convenience of explanation and not intended to be limiting. Those of skill in the art will undefstand based on the description herein that the present invention applies to any structure involving at least one PN junction, and particularly to structures where the PN junction must block high voltage.

Figure 7:
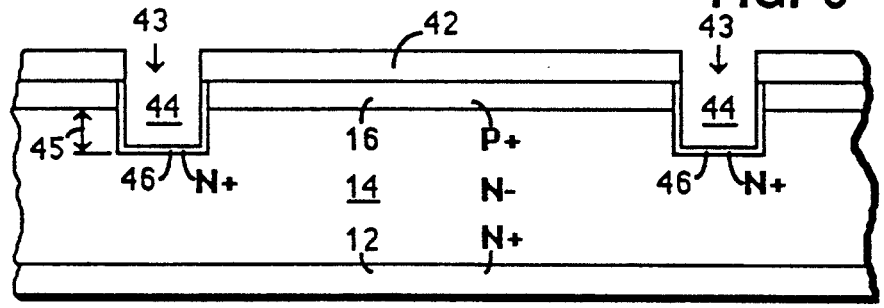

Referring now to FIGS. 6-10, substrate 40 has N+ region 12, N− region 14 and blanket P+ region 16 of thicknesses 13, 15, 17 as indicated, analogous to those shown in FIG. 1. Mask 42 having openings 43 is used to etch first grooves 44 into substrate 40. The result is shown in FIG. 7. It is important that first grooves 44 penetrate through P+ layer 16 and extend distance 45 into N− layer 14. Distance 45 is usefully in the range of >0 to <50-percent of thickness 15, more conveniently about 2-30 percent of thickness 15 and typically about 5-10 percent of thickness 15.

Preferably without removing mask 42, N+ region 46 is conveniently formed at least on the bottoms of first grooves 44 by diffusion or ion implantation. Mask 42 may be the same mask used for etching first grooves 44, and so formation of N+ regions 46 does not require a separate masking operation. While region 46 may extend on sidewalls of grooves 44, as shown in FIG. 7, this is not essential. It is only necessary that N+ region 46 be present on the portion of the bottoms of grooves 44 that will remain undisturbed following formation of second grooves 56 to be subsequently described.

Figure 8:
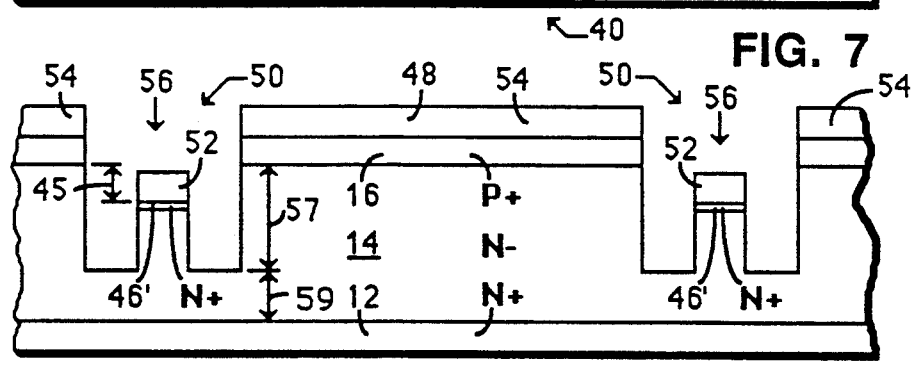
Figure 9:
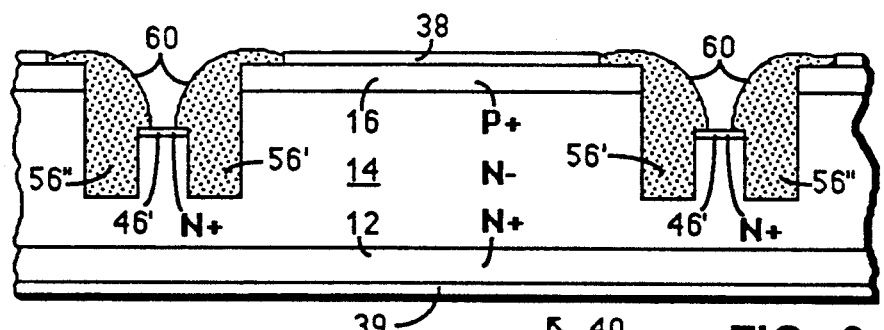

Mask 42 is removed and mask layer 48 applied having closed regions 54 on P+ layer 16, closed regions 52 on part 46′ of region 46 in first grooves 44, and open regions 50 therebetween. Second grooves 56 are then etched into substrate 40 to depth 57 in region 14, leaving thickness 59 of region 14 undisturbed. The parts 46′ of region 46 beneath mask portions 52 are also left undisturbed. The result is shown in FIG. 8. Depth 57 exceeds depth 45 and is usefully in the range of at least 50% of thickness 15, preferably about 55-80% percent of thi.ckness 15 and typically about 60-70% of thickness 15. It has been found that by not cutting grooves 56 all the way through region 14 into initial substrate 12, the incidence of wafer breakage during manufacturing is significantly reduced. This is a great advantage.

Passivation 60 is then applied and patterned to fill parts 56′ and 56″ of grooves 56 as indicated. Metallizations 38 and 39 are applied using means well known in the art in a manner similar to that employed in connection with FIGS. 4-5.

Figure 10:
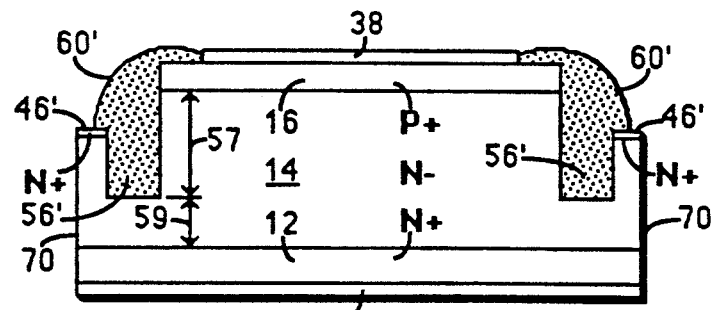

Central part 46′ of layer 46 that remains between first part 56′ and second part 56″ of grooves 56 is desirably left at least partly exposed to facilitate separation of substrate 40 into individual die 41 as shown in FIG. 10.

The above-described process uses four masking operations, as follows: delineate first groove, delineate second groove, delineate passivation, and delineate metal. This is the same number as the process shown in FIGS. 1-5 which etched through region 14, but that requirement is avoided. Four masking operations is less than other processes used to provide N+ channel stop 46 laterally outside groove 56′. If etching groove 56′ through region 14 is to be avoided, then in order to avoid channelling it is essential to provide an N+ region, e.g., region 46′ at exposed die edge 70. Otherwise a channel forms which extends up exposed side 70 of die 41 and around groove 56′ to P+ region 16.

Having groove 56′ extend only partway through region 14, not only avoids the wafer weakening effects of the prior art process but also helps to properly shape the electric field extending from the PN junction between regions 14 and 16 where it meets the sidewall of groove 56′. If groove 56′ is too shallow field bending reduces the electrical breakdown strength. Passivation material 60' aids in preventing breakdown or flash-over. If groove 56' is too deep, excessive etch time is required and wafer strength is reduced. Thus, for best performance and manufacturability, it is important for grooves 56 to have the proper depth relative to the thickness of the N− layer, as explained above.

It has been further determined that having region 46 depressed below the surface associated with region 16 and having groove 56' deeper than groove 44 and region 46' allows passivation region 60' to assume a particularly advantageous shape which creates very little roughness on the surface of region 16 near metallization 38. This improves manufacturability by reducing surface discontinuities as compared to structures where region 46 is not depressed relative to the surface of region 16. This is a further advantage of the present process and structure.

Figure 11:
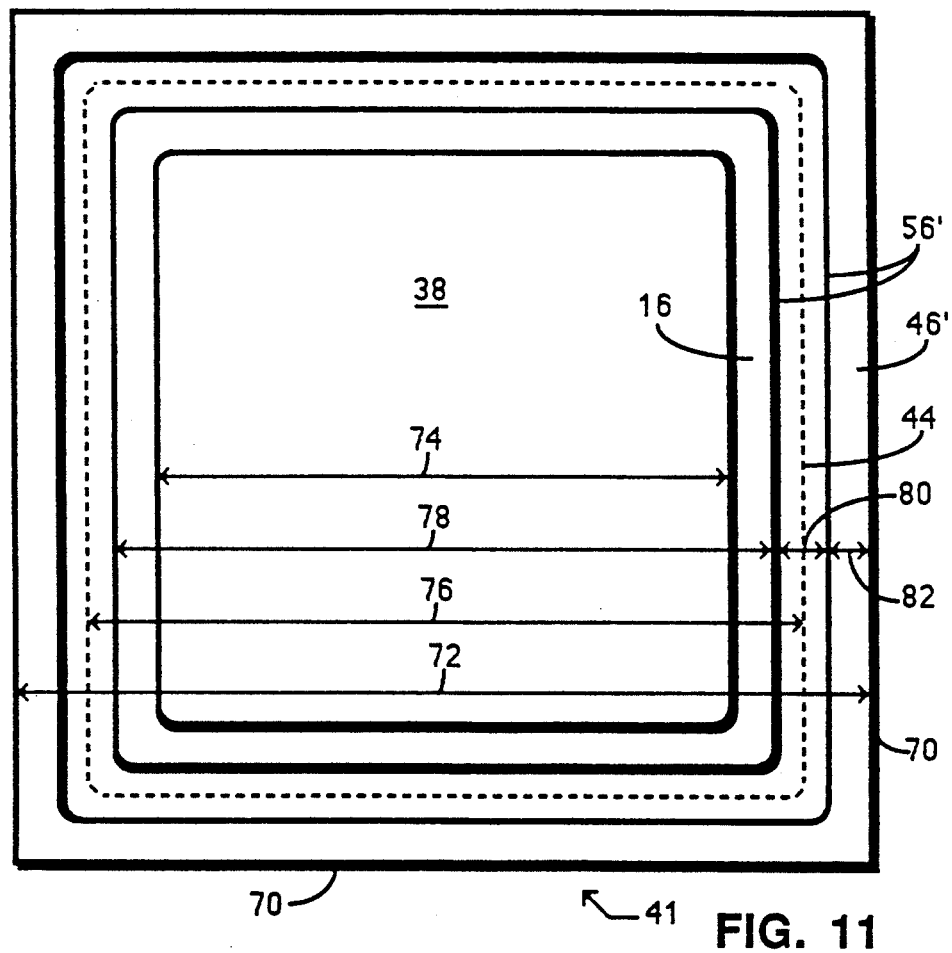
FIG. 11 shows a simplified plan view of the device of FIG 10.

FIG. 11 shows a plan view of the device of FIG. 10 in highly simplified form. For convenience in viewing the underlying regions, passivation 60' of FIG. 10 has been omitted in FIG. 11. The outer perimeter of metal 38 is indicated by a solid line as well as the inner and outer perimeters of groove 56'. The original location of the inner wall of groove 44, now etched away in forming portion 56' of groove 56, is indicated by the dashed line. The remaining part 46' of region 46 forms the outer periphery of the die surface, lying between the outer wall of groove 56' and outer edge 70 of die 41.

EXAMPLE

In a typical device made according to the above described structure and process, die 41 is square with dimension 72 of about 2.64 mm (104 mils), dimension 74 of metallization 38 is about 2.03 mm (80 mils), groove 44 has an inner perimeter width 76 of about 2.26 mm (89 mils) and an annular width of about 0.38 mm (15 mils), and groove 56 has an inner perimeter width 78 of about 2.13 mm (84 mils) and an annular width of about 0.1 mm (20 mils), so that resulting groove 56' has an annular width 80 of about 0.15 mm (6 mils) and remaining portion 46' of N+ region 46 has an annular width 82 of about 0.1 mm (4 mils). However, other dimensions can also be used. Some part of region 46 is lost during die separation.

It will be observed in FIG. 11 that grooves 44 and 56 are desirably concentric and annular. As used herein, the word "annular" is intended to refer to a generally washer-like shape, irrespective of whether the perimeter is round, square, rectangular, triangular, hexagonal, or whatever, so long as it has concentric closed outer and inner boundaries when viewed perpendicular to the plane of the substrate surface. While the plan shape illustrated in FIG. 11 is particularly convenient, other plan shapes could equally well be employed.

Having described the invention, those of skill in the art will appreciate that the present invention provides improved manufacturability by reducing wafer breakage, giving a smoother upper surface than other alternatives and the same or fewer process steps. Tests performed on high voltage diodes manufactured according to the above-described process gave equal or greater breakdown voltages, flash-over voltages and equal or lower leakage currents. Manufacturing cost was significantly less than alternative approaches.

Those of skill in the art will also appreciate based on the description herein that many variations may be made without departing from the present invention. For example, although groove 56 is shown as having two parts 56'–56", so far as forming individual diode 41 is concerned only portion 56' of groove 56 is needed. portion 56" is conveniently provided so that devices adjacent to device 41 on wafer 10 have the same structure without any wasted space. While this is desirable, it is not essential. Further, while groove 56 is shown as having parts 56' and 56" symmetrically arranged around the remaining portion of region 46, this is also not essential. One of the advantages of the present process and structure is that it is tolerant of misalignment of the groove etch mask openings 43, 50. So long as some part 46' of region 46 on the bottom of groove 44 is left between portions 56' and 56", the resulting device will perform properly.

I claim:

1. A method for forming a high voltage semiconductor device comprising:
   providing a substrate having a conductive first doped region of a first thickness adjacent a first surface thereof;
   forming a first depression extending from the first surface through the first doped region;
   forming a conductive second doped region at least on a bottom part of the first depression;
   forming a second depression not entirely co-extensive with the first depression and having at least a first part overlapping a portion of the first depression and extending into the substrate from the first surface through the portion of the first depression;
   wherein the steps of forming the first and second depressions comprise forming annular first and second depressions, each having an inner and outer perimeter wherein the first part of the second depression has a smaller outer perimeter than the outer perimeter of the first depression; and
   wherein the step of forming a second depression having at least a first part further comprises forming a second part of the second depression spaced apart from the first part and having an inner perimeter greater than the outer perimeter of the second depression.

2. The method of claim 1 wherein the step of forming the second part of the second depression comprises forming the second part of the second depression with the same depth as the first part of the second depression.

3. The method of claim 1 wherein the steps of forming the first and second parts of the second depression comprise forming spaced-apart first and second parts of the second depression separated by a portion of the bottom of the first depression.

4. A process for forming a high voltage semiconductor device, comprising:
   providing a semiconductor substrate having a first conductivity type and first conductivity and having a first principal surface;
   providing a first region of an opposite second conductivity type and a second conductivity extending to a first surface of the substrate and forming a PN junction with the substrate at a first depth below the first surface;
   forming a first annular recess extending into the substrate from the first surface to a second depth greater than the first depth;
   providing a second region of the first conductivity type and a third conductivity including the bottom of the first annular recess; and
   forming a second annular recess extending from the first surface into the substrate to a third depth greater than the second depth and partially overlapping the first annular recess.

5. The process of claim 4 wherein the second and third conductivities are greater than the first conductivity.

6. The process of claim 4 wherein the step of providing the second region comprises providing the second region having a thickness less than the first depth.

7. The process of claim 6 wherein the step of forming the second annular recess comprises forming the second recess to a depth sufficient to extend through the second region where the second recess overlaps the first recess.

8. The process of claim 4 further comprising, substantially filling the second recess with a passivating material.

* * * * *